United States Patent
Arai

(10) Patent No.: US 6,330,695 B1
(45) Date of Patent: *Dec. 11, 2001

(54) DATA COMMUNICATIONS APPARATUS, DATA COMMUNICATIONS METHOD, PROGRAM FOR CODING INFORMATION DATA CONTAINED IN COMPUTER READABLE MEDIUM

(75) Inventor: Hideyuki Arai, Kawasaki (JP)

(73) Assignee: Canon Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/087,772

(22) Filed: Jun. 1, 1998

(30) Foreign Application Priority Data

Jun. 6, 1997 (JP) .................................................. 9-149203

(51) Int. Cl.[7] ...................................................... G06F 11/00
(52) U.S. Cl. ............................................. 714/712; 714/752
(58) Field of Search ..................................... 714/712, 752, 714/751

(56) References Cited

U.S. PATENT DOCUMENTS 5,313,203 * 5/1994 Suu et al. ................................ 341/50

* cited by examiner

*Primary Examiner*—Phung M. Chung
(74) *Attorney, Agent, or Firm*—Fitzpatrick, Cella, Harper & Scinto

(57) ABSTRACT

In an apparatus that performs a plurality of signal processings including the recording/reproduction operation, wire-communication operation, and radio-communication operation, part of each processing circuit or part of the function of each processing circuit is commonly used between different operations. An error-correction coding circuit, in part or entirely, is used commonly between a plurality of different signal processings so that the error-correction capability in error-correction coding or error-detection capability in error-detection coding is set to be different to the information data processed in the signal processings. With this arrangement, the apparatus is compact, low-cost, and of a simple construction, and the error-correction coding is properly performed in accordance with the quantity and nature of errors taking place in each signal processing.

26 Claims, 9 Drawing Sheets

DATA COMMUNICATIONS APPARATUS, DATA COMMUNICATIONS METHOD, PROGRAM FOR CODING INFORMATION DATA CONTAINED IN COMPUTER READABLE MEDIUM

BACKGROUND OF THE INVENTION

1. Field of the Invention

The present invention relates to a data communications apparatus, a data communications method and a program for coding information data stored in a computer readable medium and, more particularly, to the transmission, reception, recording and reproduction of an image signal.

2. Description of the Related Art

Recording/reproduction apparatuses capable of wire communications (such as a camera-integrated digital VCR or a standalone digital VCR) are now available. An image signal derived from such an apparatus is transmitted to a remote communications apparatus so that the communications apparatus presents the image signal on its display or stores it in a recording medium.

To transmit the image signal of such a recording/reproduction apparatus in a wireless manner, a detachable radio-communication unit is needed. In a compact, portable and handy recording/reproduction apparatus such as a camera-integrated VCR set, the apparatus and the radio-communication unit have to be connected as separate units, and this requirement presents difficulty designing a highly efficient system.

SUMMARY OF THE INVENTION

An object of the present invention is to solve the above-described problem.

Another object of the present invention is to provide a simple-construction, compact and low-cost data communications apparatus by commonly using circuits and the functions of the circuits between a plurality of different signal processings in radio communication, recording and reproduction of data.

As a preferred embodiment for such objects, the data communications apparatus of the present invention comprises coding means for error-correction coding or error-detection coding information data using a coding circuit which is commonly used between a recording operation and a communication operation, recording means for recording the information data which is error-correction coded or error-detection coded by the coding means, and communication means for sending outwardly the information data which is error-correction coded or error-detection coded by the coding means.

As another preferred embodiment, the data communications apparatus of the present invention comprises a coding circuit for error-correction coding or error-detection coding information data output in a plurality of different output forms, and a control circuit for controlling the coding circuit to set the error-correction capability in error-correction coding or the error-detection capability in error-detection coding to be different dependent on the output form.

As yet another preferred embodiment, the data communications apparatus of the present invention comprises a first coding circuit for error-correction coding or error-detection coding information data to be recorded in a recording medium, and a second coding circuit for error-correction coding or error-detection coding information data to be sent to an external device, using commonly part of the first coding circuit.

Yet another object of the present invention is to provide a simple and low-cost data communications method by using commonly circuits and the functions of the circuits between a plurality of different signal processings in radio communication, recording and reproduction of data.

As a preferred embodiment of for such objects, the data communications method of the present invention comprises the steps of error-correction coding or error-detection coding information data using a coding circuit which is commonly used between a recording operation and a communication operation, recording, onto a recording medium, the information data that is error-correction coded or error-detection coded by the coding circuit, and sending outwardly the information data that is error-correction coded or error-detection coded by the coding circuit.

As another preferred embodiment, the data communications method of the present invention comprises the step of controlling the coding circuit for error-correction coding or error-detection coding information data output in a plurality of output forms so that the error-correction capability in the error-correction coding or the error-detection capability in the error-detection coding is set to be different dependent on the output form.

As yet another preferred embodiment, the data communications method of the present invention comprises the steps of error-correction coding or error-detection coding information data to be recorded in a recording medium, using a first coding circuit, and error-correction coding or error-correction coding information data to be sent to an external device, using a second coding circuit that commonly uses part of the first coding circuit.

As yet another preferred embodiment, the data communications method of the present invention comprises the steps of error-correction coding or error-detection coding information data using a coding circuit that is commonly used between a radio communication and a wire communication, communicating, through a radio-communication path, the information data that is error-correction coded or error-detection coded by the coding circuit, communicating, through a wire-communication path, the information data that is error-correction coded or error-detection coded by the coding circuit.

It is a further object of the present invention to provide a program for coding information data stored in a computer-readable medium in which circuits and the functions of the circuits used in a plurality of different signal processings in radio communication, recording and reproduction of data are commonly used to perform an error-correction coding or an error-detection coding in accordance with the signal processing.

As a preferred embodiment for such an object, the program of the present invention codes information data stored in a computer-readable medium, wherein the program controls the coding circuit for error-correction coding or error-detection coding information data output in a plurality of output forms so that the error-correction capability in error-correction coding or the error-detection capability in error-detection coding is set to be different dependent on the output form.

Still other objects of the present invention, and the advantages thereof, will become fully apparent from the following detailed description of the embodiments.

DESCRIPTION OF THE PREFERRED EMBODIMENTS

First Embodiment

Figure 1:
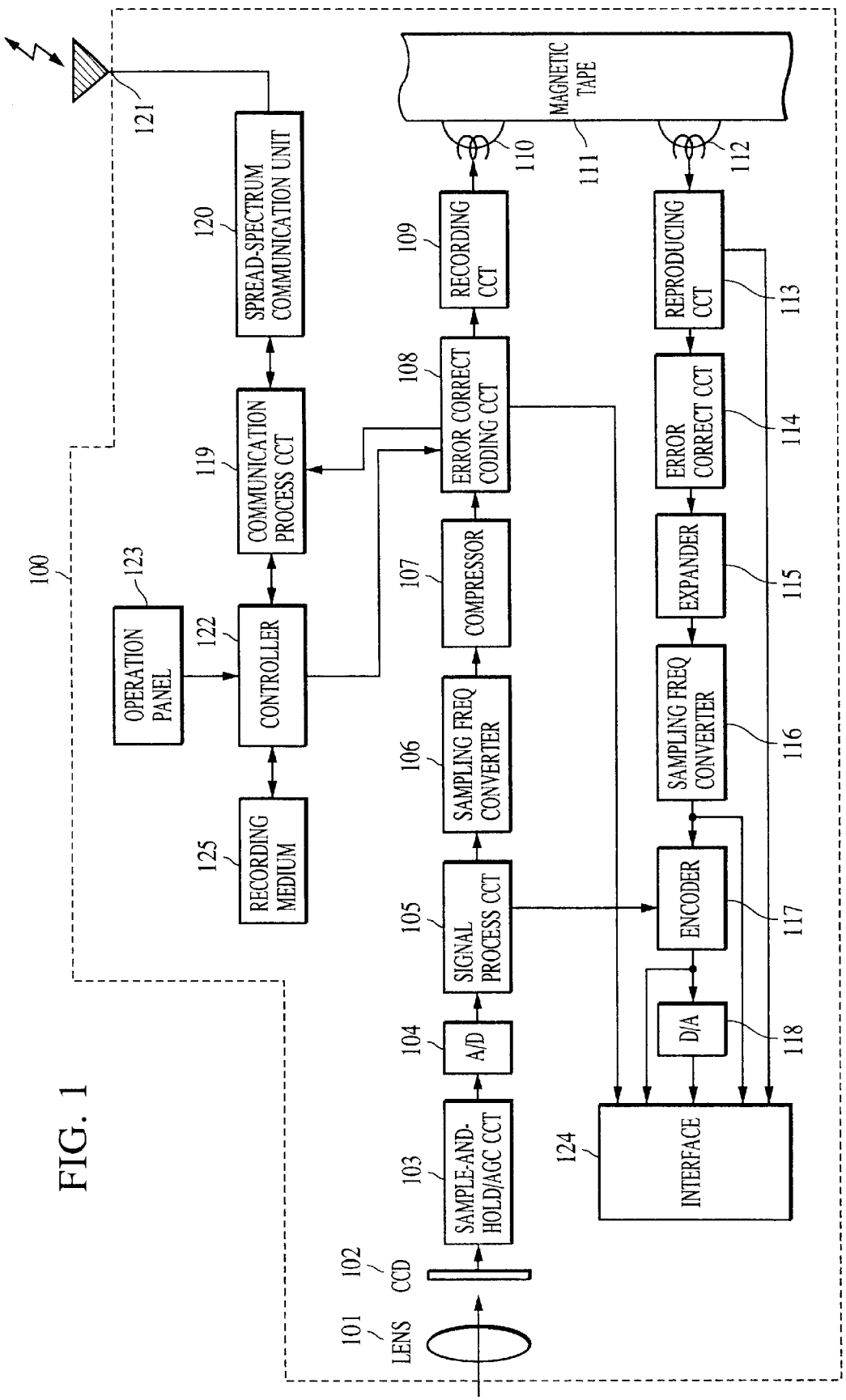
FIG. 1 is a block diagram of the radio transmitter of a first embodiment of the present invention.
Figure 2:
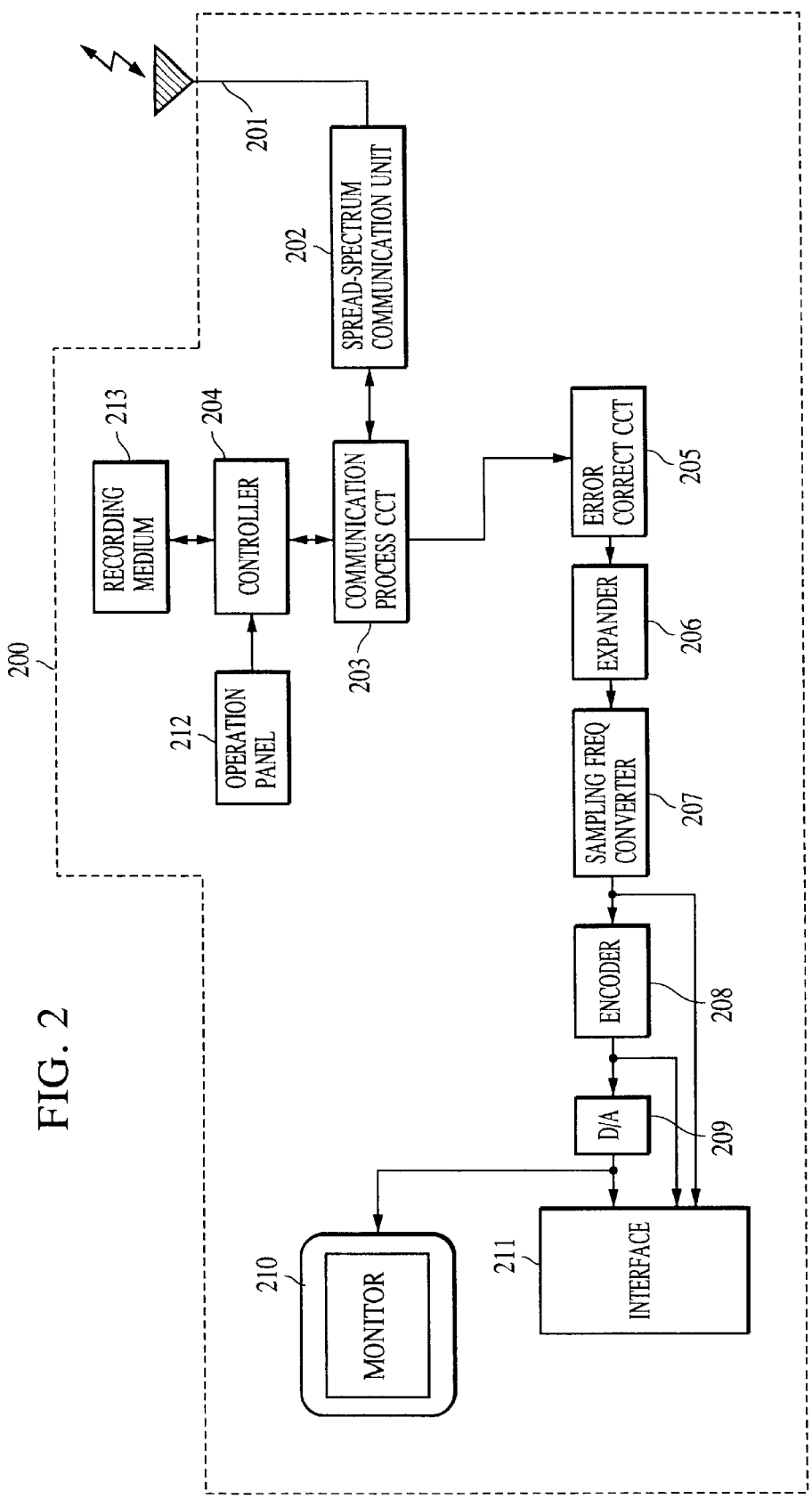
FIG. 2 is a block diagram of the radio receiver of the first embodiment of the present invention.

FIGS. 1 and 2 are block diagrams showing a radio communication system of a first embodiment of the present invention. FIG. 1 shows the radio transmitter of the first embodiment, and FIG. 2 shows the radio receiver of the first embodiment.

Referring now to FIG. 1, the radio transmitter 100 of the first embodiment is discussed.

As shown, an image pickup device 102 constructed of a CCD or the like converts the optical image of an object collected through a lens 101 into an electrical signal, and feeds it to a sample-and-hold/AGC circuit 103. The sample-and-hold/AGC circuit 103 samples and holds the electrical signal (RGB signal or YMC signal) fed by the image pickup device 102 to process it to an appropriate signal level. An A/D converter 104 converts the analog signal output by the sample-and-hold/AGC circuit 103 into a digital signal and feeds it to a signal processing circuit 105. The signal processing circuit 105 produces a predetermined image signal (a component signal containing a luminance signal and two color difference signals having a rate of sampling frequencies at 4:2:2) from the image signal from the lens 101 and image pickup device 102. A sampling frequency converter 106 converts the image signal (constructed of the luminance signal and color difference signals) output by the signal processing circuit 105 for a rate of sampling frequencies at 4:1:1 or 4:2:0. Since the NTSC image signal is used in this embodiment, the rate of sampling frequencies of luminance signal and color difference signals is set to be 4:1:1 in this embodiment. The output signal from the sampling frequency converter 106 is fed to a compressor 107, where the signal is compressed using a known low bit-rate coding method.

Figure 3:
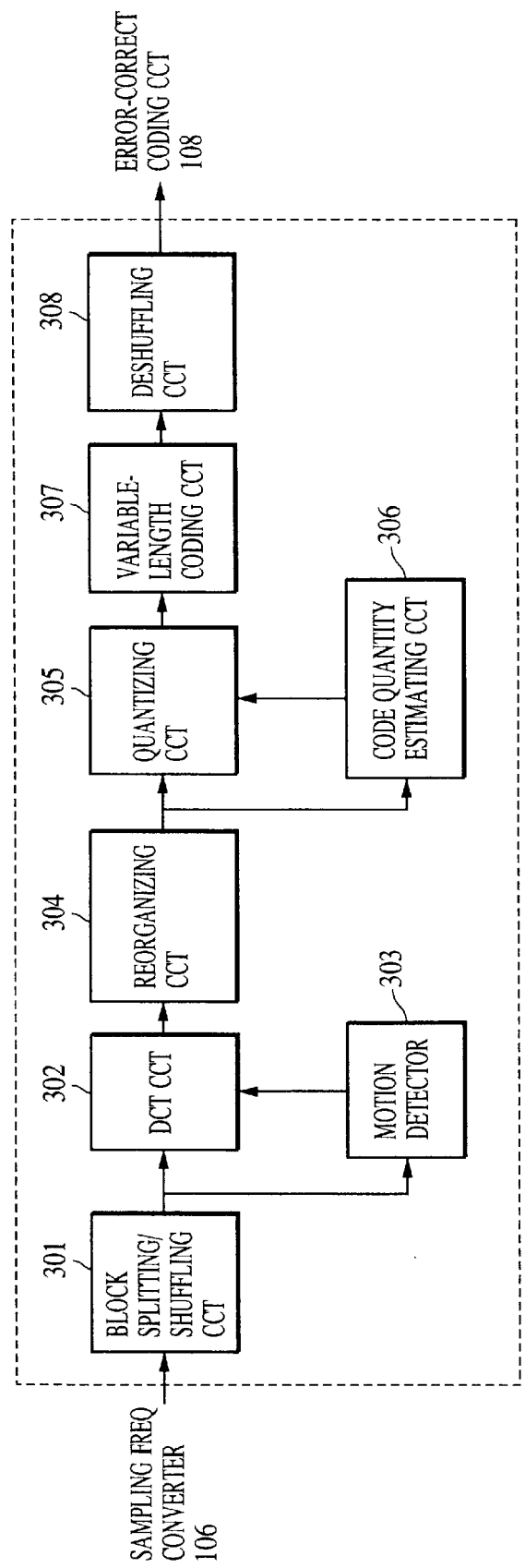
FIG. 3 shows the construction of a compressor 107.

Referring to FIG. 3, the construction of the compressor 107 is discussed in detail. The compressor 107 performs DCT (discrete cosine transform), quantization, and variable-length coding on a one-screen (one frame) image signal, thereby performing compression coding.

As shown in FIG. 3, the image signal output by the sampling frequency converter 106 is fed to a block splitting/shuffling circuit 301. The block splitting/shuffling circuit 301 converts the one-frame image signal of each of the luminance signal and the two color difference signals into blocks, each block being eight pixels by eight pixels. A macro block is constructed of six blocks, namely four blocks for the luminance signal and two blocks for the color difference signal. Macro blocks are set to be a predetermined unit of fixed length (five macro blocks, for example), and a shuffling action is performed in the screen so that the amount of information in the unit of fixed length (hereinafter referred to as segment) becomes an averaged value.

A motion detector 303 detects motion each time a block is output by the block splitting/shuffling circuit 301, and determines whether the screen is in a still mode or a moving mode. A DCT circuit 302 switches DCT process to each block in response to the output of the motion detector 303. In the still mode, the DCT circuit 302 performs DCT process on each block (eight pixels by eight pixels). In the moving mode, the DCT circuit 302 splits one block (eight pixels by eight pixels) into a first field and a second field, each being four pixels by eight pixels, and performs DCT process on each field of four pixels by eight pixels.

A reorganizing circuit 304 performs a zigzag scan on each DCT processed block, and DCT coefficients are reorganized in the order of zigzag scan. After all blocks in a segment are DCT processed, a quantizing circuit 305 quantizes the segment using a quantizing table. The quantizing table is selected by a code quantity estimating circuit 306 so that the amount of code of the segment will not exceed a predetermined number of bits, after the segment is variable-length coded by a subsequent variable-length coding circuit 307.

A deshuffling circuit 308 packs, in sync blocks of predetermined number, the data of each segment thus compression-coded. In this embodiment, data of each unit segment (one segment is constructed of five macro blocks) compressed is packed in five sync blocks in accordance with a predetermined rule. The data of each sync block is deshuffled such that the data is read in the order of raster scan. The image of one frame thus deshuffled is fed to an error-correction coding circuit 108 as compressed image data. The compressor 107 performs compression coding using DCT process. Alternatively, the compressor 107 may use compression coding process based on other orthogonal transformation coding (such as Hadamard transform or wavelet transform).

Figure 4:
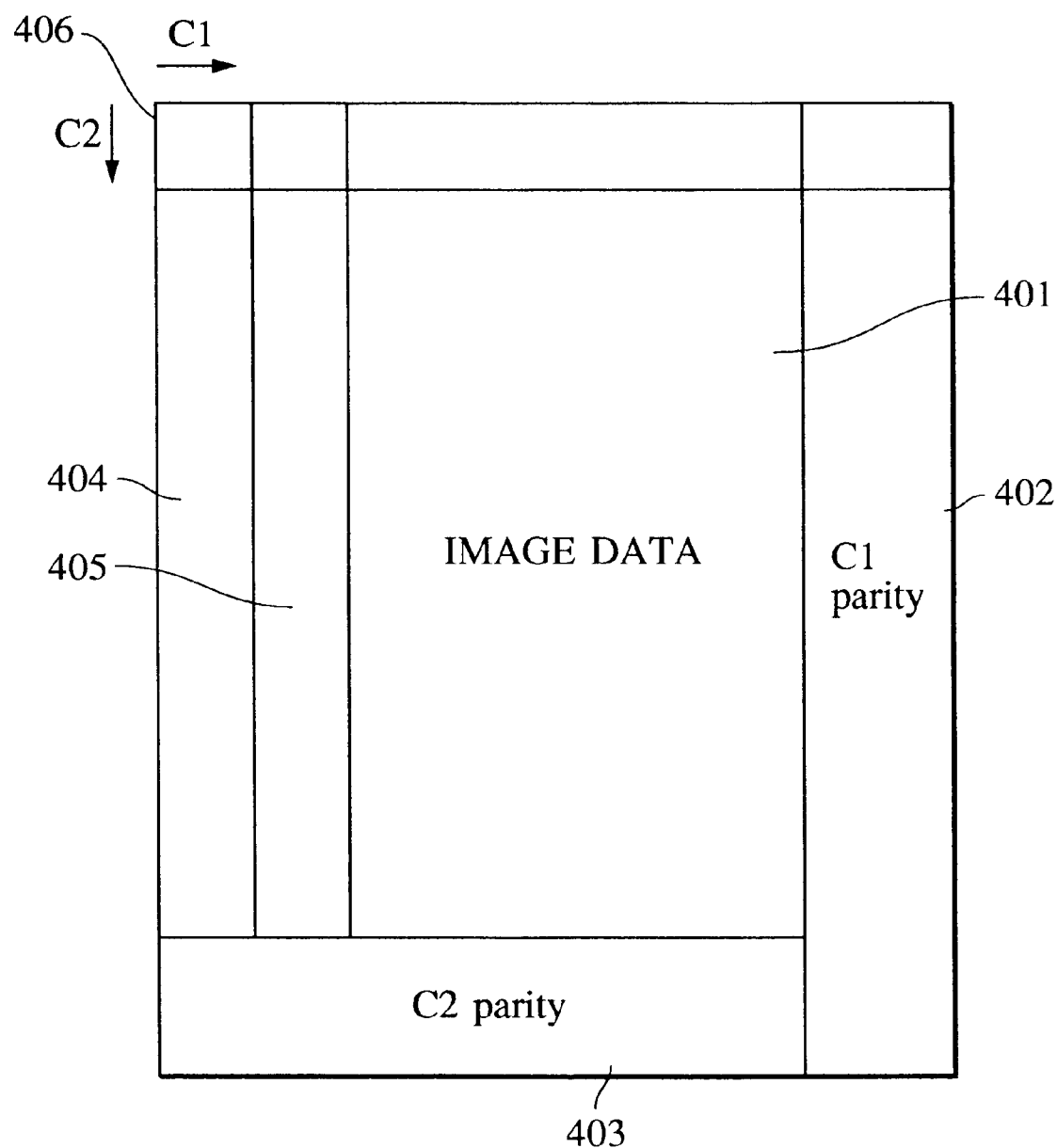
FIG. 4 shows the organization of error-correction code data.

The image data compressed-coded by the compressor 107 is fed to the error-correction coding circuit 108 to be error-correction coded. The error-correction coding circuit 108 in this embodiment error-correction codes compressed image data of one track based on the Reed-Solomon coding. FIG. 4 shows an example of error-correction code data. As shown, the compressed image data 401 of one track is constructed of a predetermined number of sync blocks. The data of one track means a unit of data to be recorded or transmitted. Also shown are an internal code parity 402 (C1 parity), an external code parity 403 (C2 parity), synchronization data 404 for each sync block, positional data 405 for indicating the position of each sync block on screen, and code data 406 for one sync block.

Figure 5:
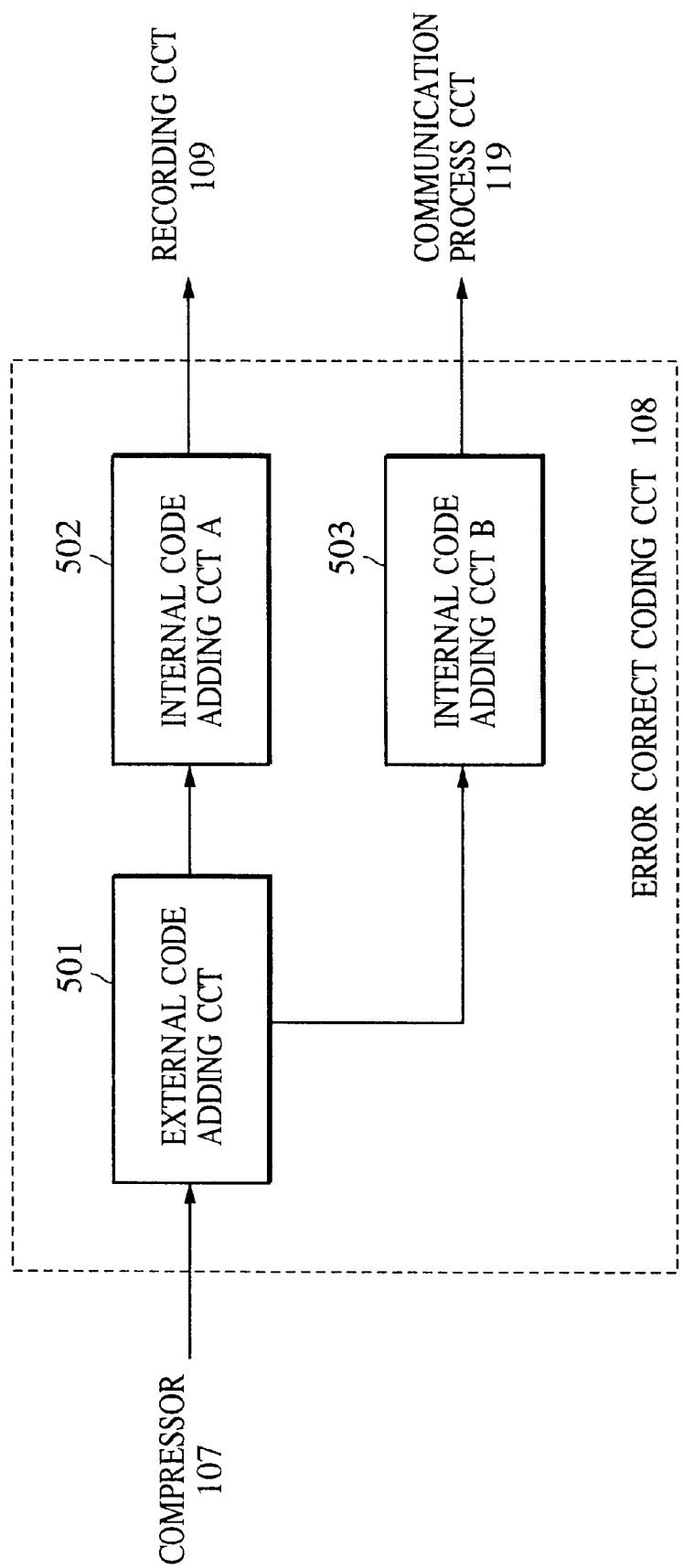
FIG. 5 shows the construction of an error-correction coding circuit 108.

Referring to FIG. 5, the construction of the error-correction coding circuit 108 is now discussed in detail.

As shown, an external code adding circuit 501 adds an external code parity (a first check code for error correction) to the image data (compressed image data of one track in this embodiment) to be recorded, wire-transmitted, or radio-transmitted. An internal code adding circuit A 502 adds an internal code parity (a second check code for error correction) to the image data to be recorded or wire-transmitted. An internal code adding circuit B 503 adds an internal code parity (a third check code for error correction) to the image data to be radio-transmitted. The internal code adding circuit A 502 and internal code adding circuit B 503 add parities of different error-correction capabilities to comply with difference in quantity and nature of errors in the image data output in the recording/reproduction operation, wire-communication operation and radio-communication operation. The first embodiment is designed to present a higher error-correction capability in the radio-communication operation than in the wire-communication operation.

A controller 122 controls the error-correction coding process of the error-correction coding circuit 108 in response to an instruction of an operation panel 123. The controller 122, having an microcomputer, controls generally the operation of the radio transmitter 100 in response to instructions "recording start", "wire transmission start", "radio transmission start" issued by the operation panel 123. The recording start instruction in this embodiment initiates the recording operation for the image signal being picked up. The radio transmission start instruction initiates the radio transmission of the image signal being recorded or the image signal being picked up. The wire transmission start instruction initiates the wire transmission of the image signal being reproduced or the image signal being picked up, in a diversity of signal forms.

When the radio transmitter 100 records or wire-transmits the image signal being picked up, the external code adding circuit 501 and internal code adding circuit A 502 add their respectively generated external and internal code parities to the compressed image data of one track to carry out error-correction coding. When the radio transmitter 100 radio-transmits the image signal being picked up or the image signal being recorded, the external code adding circuit 501 and internal code adding circuit B 503 add their respectively generated external and internal code parities to the compressed image data of one track to carry out error-correction coding. In other words, part of the function or circuit of the error-correction coding circuit 108 is thus shared between the error-correction coding in the recording, reproduction, wire-communication operation and the error-correction coding in the radio-communication operation in this embodiment. The error-correction capability of the internal code parity is set to be different between the recording/reproduction and wire-communication operations and the radio-communication operation in this embodiment. Alternatively, the same internal code adding circuit may be used so that the error-correction coding having the same error-correction capability may be performed on both the recording/reproduction and wire-communication operations and the radio-communication operation. Furthermore, the error-correction coding may be performed using a set of external and internal code parities (the first and second check codes) during the recording/reproduction and wire-communication operations, while the error-correction coding may be performed using another set of external and internal code parities (the first and third check codes) besides the first set of external and internal code parities (the first and second check codes) during the radio-communication operation. The error-correction coding circuit 108 thus performs the error-correction coding with a high error-correction performance in the radio-communication operation.

The image data, error-correction coded by the error-correction coding circuit 108, is fed to a recording circuit 109, a communication processing circuit 119, and an interface 124 for the processing operation of the radio transmitter 100 under the control of the controller 122.

The recording circuit 109 performs signal processings for recording, such as digital modulation, on the error-correction coded image data. Specifically, the recording circuit 109 performs 24/25-modulation and interleave NRZI process on the error-correction coded image data of one track and adds an ID code (the synchronization data 404 and the positional data 405 indicating the position of each sync block on screen) to each sync block data. The image data thus processed is recorded on each track on a magnetic tape 111 via a magnetic recording head 110.

To reproduce the image data recorded on the magnetic tape 111, a reproducing circuit 113 reproduces the image data via a magnetic reproducing head 112. The reproduced data is fed to an error-correction circuit 114, where the data is error-corrected on a track-by-track basis.

Figure 6:
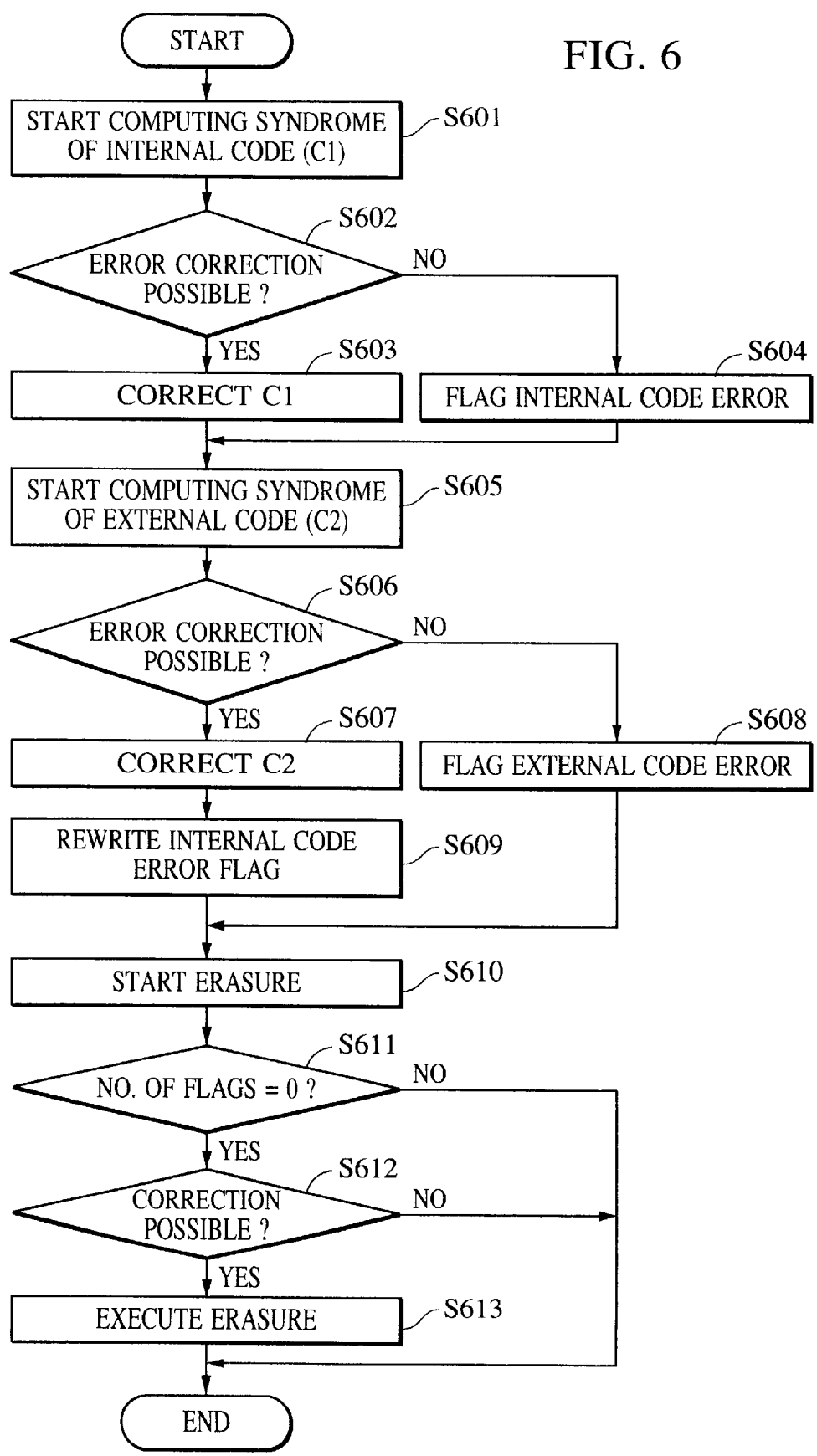
FIG. 6 is a flow diagram showing the operation of an error-correction circuit 114.

Referring to a flow diagram shown in FIG. 6, the operation of the error-correction circuit 114 is now discussed.

The error-correction circuit 114 starts computing a syndrome from the internal code direction (C1) in connection with the compressed image data of one track reproduced from the magnetic tape 111 (step S601). When the syndrome calculation shows that the syndrome is not 0, it is determined that an error is present in the code, and a determination is made of whether the error is correctable (step S602). When correctable, the error is corrected (step S603). When not correctable, an internal code error flag is set (step S604).

Syndrome calculation is made in an external code direction (C2) subsequent to the syndrome calculation of the internal code direction (C1). When the syndrome calculation shows that the syndrome is not 0, it is determined that an error is present in the code, and a determination is made of whether the error is correctable (step S606). When correctable, the error is corrected (step S607). When not correctable, an internal code error flag is set (step S608).

When the external code direction (C2) is successfully corrected, the address of the corrected data in the internal code direction is computed, and the internal code error flag of the internal code direction setting the syndrome to be 0 is rewritten (step S609).

After the error-correction process is performed in the internal and external codes, the error-correction circuit 114 sets the internal code error flag to be an erasure flag, starting erasure correction in the external code direction (step S610).

The error-correction circuit 114 checks the number of the internal code error flags. When the number of the error flags is zero, the error-correction circuit 114 determines that all data is free from error, and ends the error-correction process (step S611).

The error-correction circuit 114 checks the number of the internal code error flags to determine whether erasure correction is possible (step S612). When the number of the flags is found to be within an inexecutable range of erasure correction in step S612, the error-correction circuit 114 ends the error-correction process leaving the error flags as they are. When the number of the flags is within a correctable range, the erasure correction is performed (step S613), and the error-correction process ends. The position of error data to be corrected in the erasure correction is determined by the internal code error flag and the external code error flag.

The error-correction circuit 114 error-corrects the compressed image data of one track as described above. The error-correction circuit 114 can further perform a variety of interpolation processes using the internal and external code error flags on the data that is not corrected in the above error-correction process.

The image data, error-corrected by the error-correction circuit 114, is fed to an expander 115, which performs an expanding process, the reverse of the compression coding process performed by the compressor 107. A sampling frequency converter 116 performs a variety of interpolation processes on the color difference signals so that the rate of sampling frequencies of the reproduced image signal (constructed of a luminance signal and two color difference signals) is converted from 4:1:1 to 4:2:2. The image signal processed by the sampling frequency converter 116 is fed to an encoder 117 and the interface 124.

The image signal (the luminance signal and the two color difference signals) is converted to an RGB signal or YMC signal in the encoder 117, and is then fed to a D/A converter 118 and the interface 124. The encoder 117 receives, from the signal processing circuit 105, the image signal being picked up. In this way the image signal being picked up can be directly delivered to an external device by way of the interface 124. The image signal is converted into an analog signal by the D/A converter 118, and is then fed to the interface 124. Before subjecting the compression-coded image data to error correction, the interface 124 can directly send to an external device the compression-coded image data, reproduced by the reproducing circuit 113 or supplied by the error-correction coding circuit 108. The interface 124 packetizes the input signal into a packet of predetermined data amount, adds a code for error detection to the packet, and sends it outwardly via a communication cable. The interface 124 is provided with both an interface circuit capable of outputting an analog signal and an interface circuit capable of outputting a digital signal. The digital interface circuit can perform two-way communications with an external device, and for example, is capable of communicating moving image data of a predetermined quantity at regular intervals in a predetermined communication cycle. With this arrangement, the moving image data reproduced from the magnetic tape 111 or the video signal picked up by the lens 101 and the image pickup device 102 are transmitted on a real-time basis.

The image data, error-correction coded by the error-correction coding circuit 108, is also supplied to the communication processing circuit 119 under the control of the controller 122. The communication processing circuit 119 processes the error-correction coded image data of one track unit for a communication format that is appropriate for transmission in spread-spectrum communication, and feeds it to a spread-spectrum communication unit 120.

In this embodiment, the spread-spectrum technique is applied in radio communication as follows. The transmitter side spreads a baseband signal using a spread-spectrum code string such as pseudonoise code to produce a modulated signal spread over a broad band, much wider than the baseband signal prior to modulation. The spread signal is then PSK (phase-shift keying) modulated or FSK (frequency-shift keying) modulated, and is converted in RF (radio frequency) signal to be transmitted to the receiver side. The receiver side correlates the received spread modulated signal using the same spread-spectrum code string as the transmitter side (inverse spreading), thereby converting the spread modulated signal into a narrow band signal corresponding to the base band. Data processing, corresponding to that carried out in the transmitter side, is then performed to recover digital data prior to transmission.

Figure 7:
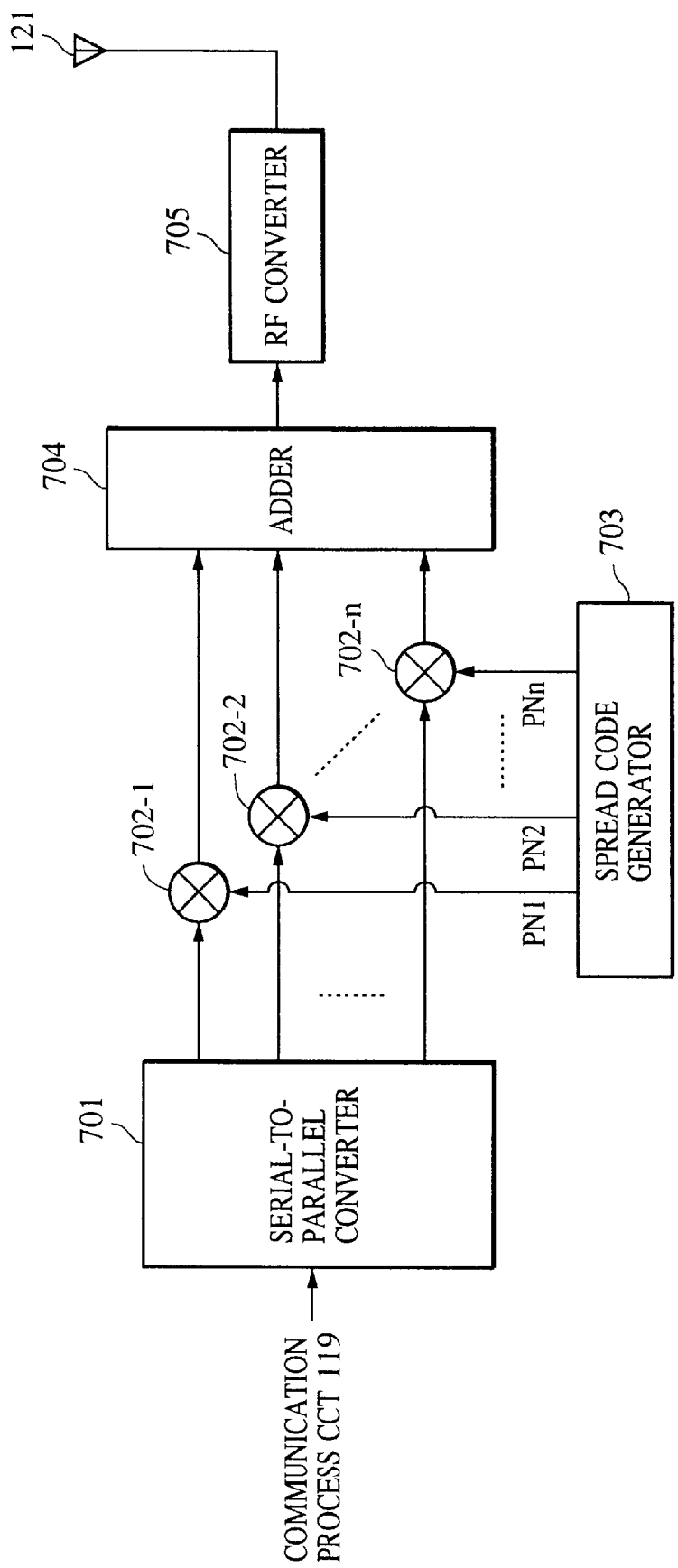
FIG. 7 shows the transmitter circuit in a spread-spectrum communication unit 120.

FIG. 7 shows the transmitter circuit in the spread-spectrum communication unit 120. The transmission operation of the circuit is now discussed.

As shown, the data, supplied by the communication processing circuit 119, is converted into n pieces of parallel data by a serial-to-parallel converter 701. Parallel data are respectively multiplied by n spread-spectrum codes (PN1 through PNn) generated by a spread code generator 703 in respectively n multipliers 702-1 through 702-n, and n-channel spread signals are produced. The outputs of the multipliers 702-1 through 702-n are added by an adder 704 and are then output to an RF converter 705. The RF converter 705 converts the spread signal into a transmitting frequency signal having an appropriate center frequency, and the transmitting frequency signal is then radio-transmitted through an antenna 121.

Using the spread-spectrum communication unit 120 thus constructed, the image signal picked up by the lens 101 and the image pickup device 102 is transmitted to an external radio receiver 200 in this embodiment. The controller 122 may generate control commands for controlling the radio receiver 200 for a variety of operations, and the control commands may be transmitted via the communication processing circuit 119 and spread-spectrum communication unit 120.

Figure 8:
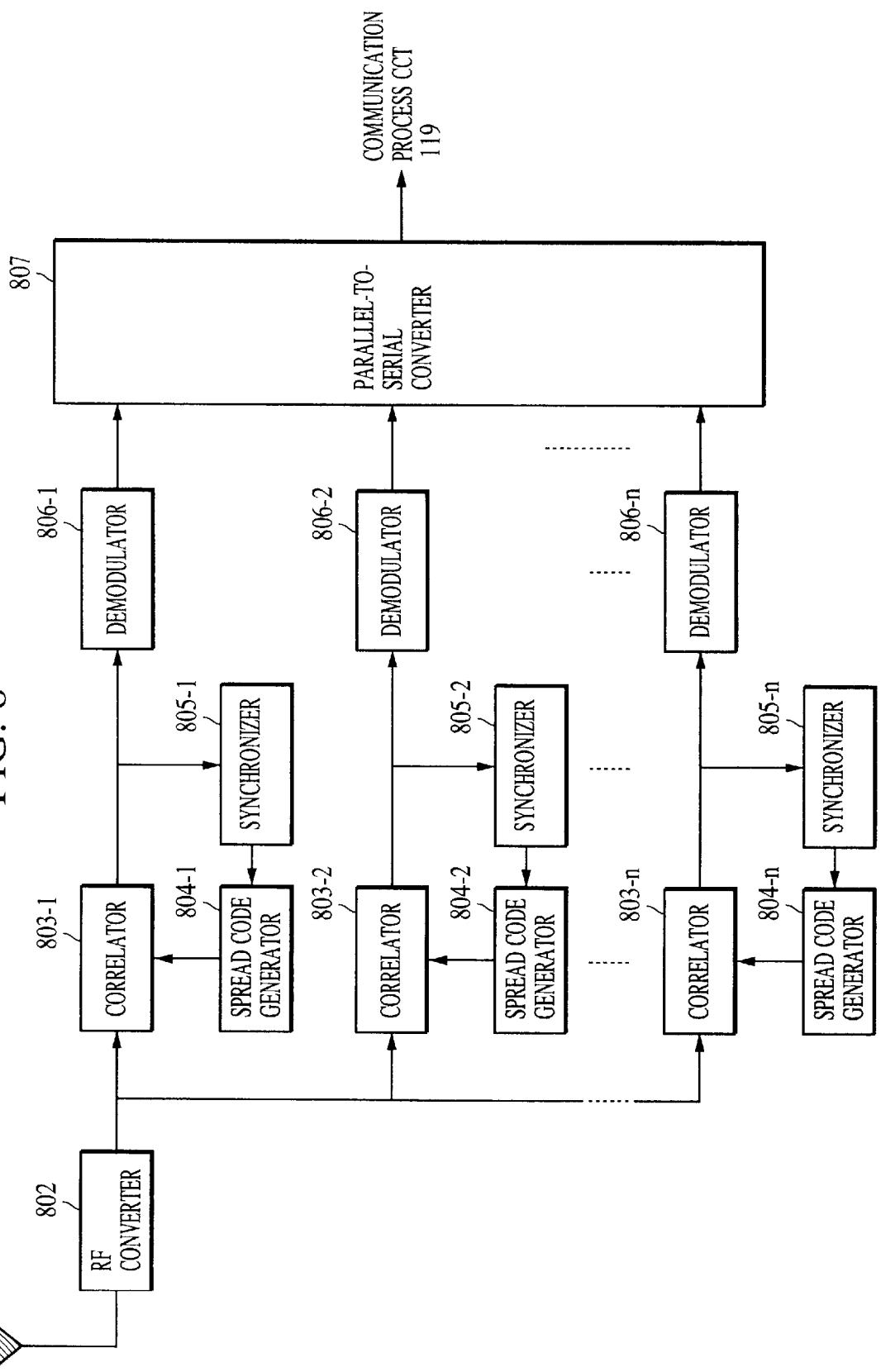
FIG. 8 shows the receiver circuit in the spread-spectrum communication unit 120.

FIG. 8 shows the receiver circuit in the spread-spectrum communication unit 120. The reception operation of the circuit is now discussed.

As shown, the signal, received by the antenna 121, is appropriately filtered, amplified and converted into an intermediate frequency signal by an RF converter 802. The intermediate frequency signal is fed to correlators 803-1 through 803-n corresponding to the n channels. The signal fed to the n-channel correlators 803-1 through 803-n is correlated with a spread code string generated by spread code generators 804-1 through 804-n for inverse spreading. Synchronizers 805-1 through 805-n of n channels make the code phase and clock of the inverse spread code string generated by the spread code generators 804-1 through 804-n to be aligned with each other, and establishes, in each channel, synchronization of each of the inverse spread n channel signals. Furthermore, the inverse spread n channel signals are fed to respective succeeding demodulators 806-1 through 806-n to be converted into digital signals. The demodulators 806-1 through 806-n feed the digital signals in parallel to a parallel-to-serial converter 807. The parallel-to-serial converter 807 performs, on the plurality of pieces of parallel data supplied by the demodulators 806-1 through 806-n, a process, the reverse of the one performed by the serial-to-parallel converter 701 at the transmitter side, thereby recovering the digital data prior to transmission. The received signal, recovered by the parallel-to-serial converter 807, is output to the communication processing circuit 119.

By the use of the spread-spectrum communication unit 120 thus constructed, the receiver receives the information signal (for example, the control commands for controlling a variety of operations) transmitted by an external spread-spectrum communication unit.

Referring to FIG. 2, the radio receiver 200 of the first embodiment is now discussed.

As shown, the radio signal transmitted from the radio transmitter 100 is received through an antenna 201. The signal received through the antenna 201 is fed to a spread-spectrum communication unit 202, which performs the receiving operation as described above to recover the digital signal prior to transmission by the radio transmitter 100. The signal, recovered through the spread-spectrum communication unit 202, is input to a communication processing circuit 203, which performs a process corresponding to the one performed by the communication processing circuit 119 in the radio transmitter 100. When the signal input to the communication processing circuit 203 is a control command for controlling the operation of the radio receiver 200, the control command is fed to a controller 204 containing a microcomputer. The controller 204 controls generally the radio receiver 200 to perform the process in accordance with the control command. The signal, input to the communication processing circuit 203, is an image signal, it is fed to an error-correction circuit 205.

The error-correction circuit 205 performs the error-correction coding corresponding to the one performed by the error-correction coding circuit 108 already described. Specifically, in this embodiment, the error-correction coding is performed using the internal code parity and the external code parity generated by the error-correction coding circuit 108 in the radio transmitter 100. The error-correction circuit 205 in this embodiment performs the error-correction coding identical to the coding performed by the error-correction circuit 114 shown in FIG. 6.

The image data, error-correction coded by the error-correction circuit 205, is supplied to an expander 206, which performs the expanding process which is the reverse of the compression process by the compressor 107. A sampling frequency converter 207 performs a variety of interpolation processes on the color difference signals so that the rate of sampling frequencies of the image signal radio-transmitted (the luminance signal and the two color difference signals) is changed from 4:1:1 to 4:2:2. The image signal thus converted by the sampling frequency converter 207 is fed to an encoder 208 and an interface 211.

The image signal (the luminance signal and the two color difference signals) is converted to an RGB signal or YMC signal in the encoder 208, and is then fed to a D/A converter 209 and the interface 211. The image signal is converted into an analog signal by the D/A converter 209, and is then fed to the interface 211 or a monitor 210. The radio receiver 200 presents the received image signal on the monitor 210 while sending the image signal in a variety of signal forms to an external device. This interface is provided with the same functions of the interface 124.

In the first embodiment, the error-correction coding circuit 108 performs error-correction coding every one track compressed image data. The present invention is not limited to this. To detect an error taking place in one track compressed image data, that compressed image data may be error-detection coded.

The error-correction coding circuit 108 in the first embodiment is designed such that the same error-correction capability in the error-correction coding is used between both the recording/reproduction operation and the wire-communication operation. The present invention is not limited to this method. Depending on the quantity or nature of errors taking place in each signal processing, an optimum error-correction process may be selected. In this way more reliable error-correction coding is achieved.

The first embodiment permits part of each processing circuit or part of the function of each processing circuit to be commonly used between different signal processings in the apparatus that performs a plurality of signal processings including the recording/reproduction operation, wire-communication operation, and radio-communication operation. With this arrangement, the apparatus is compact, low-cost and of a simple construction.

The error-correction coding circuit, in part or entirely, is used commonly between a plurality of different signal processings so that the error-correction capability in the error-correction coding is set to be different to the information data processed and output in the signal processings. With this arrangement, the apparatus is compact, low-cost, and of a simple construction, and the error-correction coding is properly performed in accordance with the quantity and nature of the error taking place in each signal processing.

The error-detection coding circuit, in part or entirely, is used commonly between a plurality of different signal processings so that the error-detection capability in the error-detection coding is set to be different to the information data processed and output in the signal processings. With this arrangement, the apparatus is compact, low-cost, and of a simple construction, and the error-detection coding is properly performed in accordance with the quantity and nature of the error taking place in each signal processing.

Second Embodiment

Figure 9:
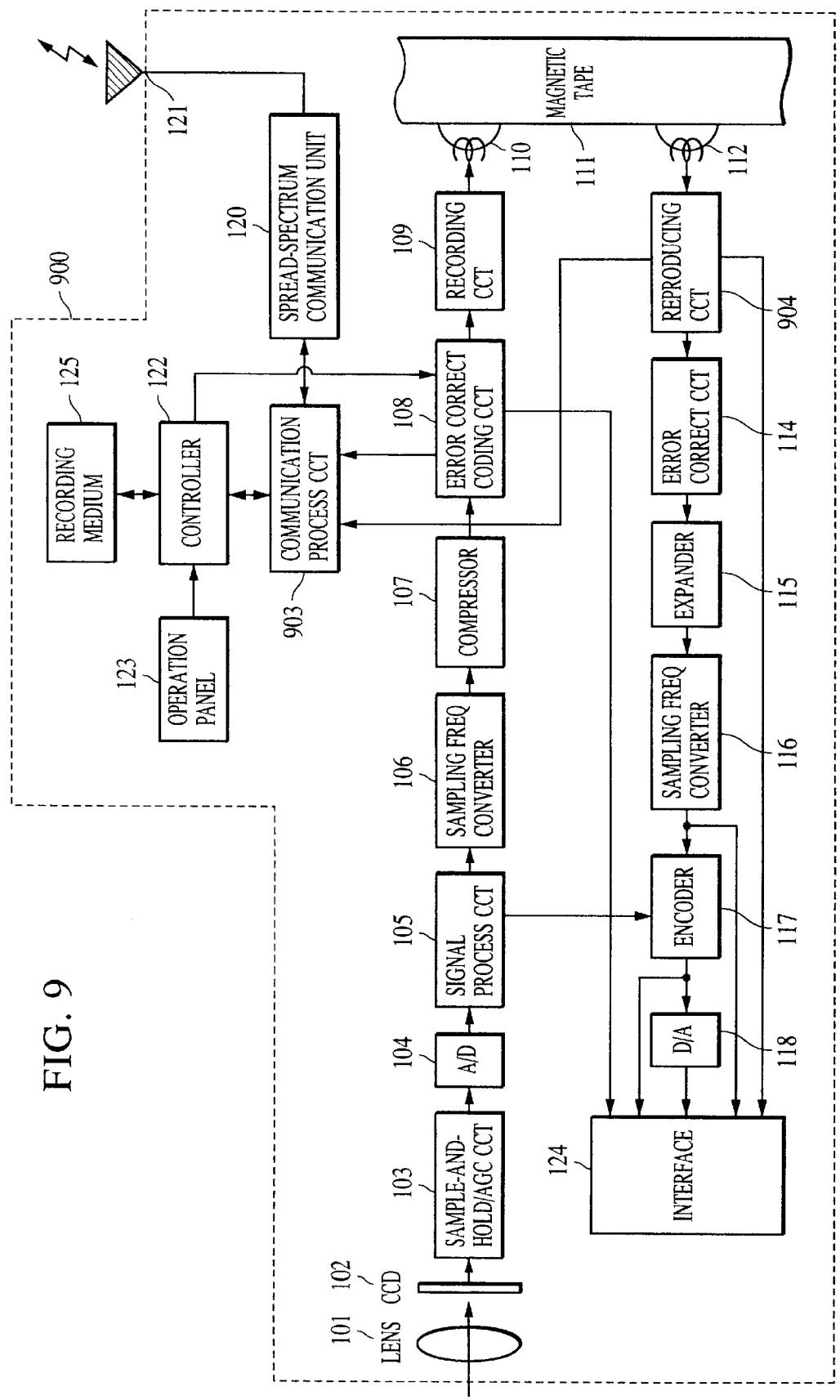
FIG. 9 is a block diagram showing a radio transmitter of a second embodiment of the present invention.

FIG. 9 is a block diagram showing a radio transmitter 900 of a second embodiment of the present invention. Like reference numerals are employed to designate like components, and description of them are not repeated.

In the first embodiment, the image signal being recorded or being picked up can be radio-transmitted. In the second embodiment, an error-correction coded compressed signal, reproduced from the magnetic tape 111, is also radio-transmitted. The operation of radio transmission of image data being reproduced is now discussed. In the second embodiment like in the first embodiment, part of the error-correction coding circuit 108 is commonly used in recording/reproduction operation, wire-communication operation, radio-communication operation to achieve an optimum error-correction coding performance in each signal processing. The radio transmitter 900 communicates the image signal with the radio receiver 200 shown in FIG. 2.

The compressed image data, reproduced from the magnetic tape 111, is input to a reproducing circuit 904 via the magnetic reproducing head 112. The reproducing circuit 904 performs a predetermined signal processing on the reproduced signal, and error-correction coded compressed image data is then fed to a communication processing circuit 903. The communication processing circuit 903 processes the error-correction coded compressed image data for a communication format that is appropriate for transmission in spread-spectrum communication, and feeds it to the spread-spectrum communication unit 120. The spread-spectrum communication unit 120 performs the same process as in the first embodiment on the compressed image data to send it to an external radio receiver 200. The reproduced image is thus seen on the monitor 210 of the radio receiver 200.

In the second embodiment, the error-correction circuit 114 performs, on the data supplied by the reproducing circuit 904 (namely, the error-correction coded compressed image data), the process corresponding to the error-correction coding process by the error-correction coding circuit 108. If the error-correction coding circuit 108 performs the error-correction coding process using the Reed-Solomon coding on the compressed image data as in the first embodiment, the error-correction circuit 114 may perform the error-correction process as described in the flow diagram shown in FIG. 6.

In the second embodiment, the error-correction coding circuit 108 performs error-correction coding every one track compressed image data. The present invention is not limited to this. In the same manner as in the first embodiment, to detect an error taking place in one track compressed image data, that compressed image data may be error-detection coded.

The error-correction coding circuit 108 in the second embodiment is designed such that the same error-correction capability in the error-correction coding is used between both the recording/reproduction operation and the wire-communication operation. The present invention is not limited to this method. Depending on the quantity or nature of errors taking place in each signal processing, an optimum error-correction process may be selected in the same manner as in the first embodiment. In this way more reliable error-correction coding is achieved.

The second embodiment permits part of each processing circuit or part of the function of each processing circuit to be commonly used between different signal processings in the apparatus that performs a plurality of processings including the recording/reproduction operation, wire-communication operation, and radio-communication operation. With this arrangement, the apparatus is compact, low-cost and of a simple construction.

The error-correction coding circuit, in part or entirely, is used commonly between a plurality of different signal processings so that the error-correction capability in the error-correction coding is set to be different to the information data processed and output in the signal processings. With this arrangement, the apparatus is compact, low-cost, and of a simple construction, and the error-correction coding is properly performed in accordance with the quantity and nature of the error taking place in each signal processing.

Furthermore in the second embodiment, the error-detection coding circuit, in part or entirely, is used commonly between a plurality of different signal processings so that the error-detection capability in the error-detection coding is set to be different to the information data processed and output in the signal processings. With this arrangement, the apparatus is compact, low-cost, and of a simple construction, and the error-detection coding is properly performed in accordance with the quantity and nature of the error taking place in each signal processing.

The invention may be embodied in other specific forms without departing from the spirit or essential characteristics thereof.

According to the first and second embodiments, the compressor 107 is designed to perform the same compression coding commonly in the recording/reproduction operation, the wire-communication operation and the radio-communication operation. The present invention is not limited to this method. The compressor 107 may present a plurality of compression coding schemes so that an optimum scheme may be selected for each of the recording/reproduction operation, wire-communication operation, and the radio-communication operation. In such a case, the error-correction coding circuit 108 is designed to perform the optimum error-correction coding process that best suits to each of the different compression coding schemes.

The error-correction coding circuit 108 in the first and second embodiments employs the same unit of compressed image data commonly in the recording/reproduction operation, the wire-communication operation and the radio-communication operation. The present invention is not limited to this method. For example, the unit of data, error-correction coded in the radio-communication operation, is set to be N times or 1/N the unit of data, error-correction coded in the recording/reproduction operation.

The data handled in the recording/reproduction operation, the wire-communication operation and the radio-communication operation is the image signal picked up by a camera section (including the lens 101, CCD 102 and the like) in the first and second embodiments. The data handled is not limited to the image signal. For example, the data handled may be information data that is chronologically continuous data like the image data, for example, speech data, graphics data, text data.

The error-correction coding circuit 108 and error-correction circuit 114 in the first and second embodiments are constituted by a plurality of processing circuits. Alternatively, the controller 122 is provided with the recording medium 125 for storing a program code that executes the error-correction coding process carried out by the error-correction coding circuit 108 so that the controller 122 performs the error-correction coding process on the compressed image data of one track under the control of the program code. Similarly, the controller 122 is provided with the recording medium 125, 213 for storing a program code that executes the error-correction process by the error-correction circuit 114, 205 so that the controller 122 performs the error-correction process on the error-correction coded compressed image data of one track under the control of the program code.

Therefore, the above-mentioned embodiments are merely examples in all respects, and must not be construed to limit the invention.

The scope of the present invention is defined by the scope of the appended claims, and is not limited at all by the specific descriptions of this specification. Furthermore, all the modifications and changes belonging to equivalents of the claims are considered to fall within the scope of the present invention.

What is claimed is:

1. An image processing apparatus comprising:
   an error-correction coder which codes image data using at least one of a first error-correction coding circuit and a second error-correction coding circuit, wherein a portion of the second error-correction coding circuit is formed by a portion of the first error-correction coding circuit;
   a recorder which records image data coded by the first error-correction coding circuit on a recording medium; and
   a communicator which sends image data coded by the second error-correction coding circuit to an external device through a wireless interface.

2. An image processing apparatus according to claim 1, wherein the wireless interface modulates the image data using a spread-spectrum communication technique.

3. An image processing apparatus according to claim 2, further comprising a compressor which compresses image data generated by an image pickup unit,
   wherein the first-error correction coding circuit and the second error-correction coding circuit are adapted to code image data compressed by the compressor.

4. An image processing apparatus according to claim 1, wherein an error-correction capability of the first error-correction coding circuit is different from an error-correction capability of the second error-correction coding circuit.

5. An image processing apparatus according to claim 4, further comprising a compressor which compresses image data generated by an image pickup unit,
   wherein the first error-correction coding circuit and the second error-correction coding circuit are adapted to code image data compressed by the compressor.

6. An image processing apparatus according to claim 1, further comprising a compressor which compresses image data generated by an image pickup unit, wherein the first-error correction coding circuit and the second error-correction coding circuit are adapted to code image data compressed by the compressor.

7. An image processing apparatus according to claim 6, wherein the image processing apparatus is a camera integrated with a recorder.

8. An image processing apparatus comprising:
   a first error-correction coding circuit which codes image data to be recorded on a recording medium; and
   a second error-correction coding circuit which codes image data to be sent to an external device through a wireless interface,
   wherein a portion of the second error-correction coding circuit is formed by a portion of the first error-correction coding circuit.

9. An image processing apparatus according to claim 8, wherein an error-correction capability of the first error-correction coding circuit is different from an error-correction capability of the second error-correction coding circuit.

10. An image processing apparatus according to claim 9, further comprising a compressor which compresses image data generated by an image pickup unit, wherein the first error-correction coding circuit and the second error-correction coding circuit are adapted to code image data compressed by the compressor.

11. An image processing apparatus according to claim 8, wherein the wireless interface modulates the image data using a spread-spectrum communication technique.

12. An image processing apparatus according to claim 11, further comprising a compressor which compresses image data generated by an image pickup unit, wherein the first error-correction coding circuit and the second error-correction coding circuit are adapted to code image data compressed by the compressor.

13. An image processing apparatus according to claim 8, further comprising a compressor which compresses image data generated by an image pickup unit, wherein the first error-correction coding circuit and the second error-correction coding circuit are adapted to code image data compressed by the compressor.

14. An image processing apparatus according to claim 13, wherein the image processing apparatus is a camera integrated with a recorder.

15. An image processing method comprising the steps of:

coding image data using at least one of a first error-correction coding circuit and a second error-correction coding circuit, wherein a portion of the second error-correction coding circuit is formed by a portion of the first error-correction coding circuit;

recording image data that was coded by the first error-correction coding circuit on a recording medium; and sending image data that was coded by the second error-correction coding circuit to an external device through a wireless interface.

16. A method according to claim 15, wherein the wireless interface modulates the image data using a spread-spectrum communication technique.

17. A method according to claim 16, further comprising the step of compressing image data generated by an image pickup unit, wherein the first error-correction coding circuit and the second error-correction coding circuit are adapted to code image data compressed in the compressing step.

18. A method according to claim 15, wherein an error-correction capability of the first error-correction coding circuit is different from an error-correction capability of the second error-correction coding circuit.

19. A method according to claim 18, further comprising the step of compressing image data generated by an image pickup unit, wherein the first error-correction coding circuit and the second error-correction coding circuit are adapted to code image data compressed in the compressing step.

20. A method according to claim 15, further comprising the step of compressing image data generated by an image pickup unit, wherein the first error-correction coding circuit and the second error-correction coding circuit are adapted to code image data compressed in the compressing step.

21. An image processing method comprising the steps of:

coding image data to be recorded on a recording medium, using a first error-correction coding circuit; and coding image data to be sent to an external device through a wireless interface, using a second error-correction coding circuit, wherein a portion of the second error-correction coding circuit is formed by a portion of the first error-correction coding circuit.

22. A method according to claim 21, wherein the wireless interface modulates the image data using a spread-spectrum communication technique.

23. A method according to claim 22, further comprising the step of compressing image data generated by an image pickup unit, wherein the first error-correction coding circuit and the second error correction coding circuit are adapted to code image data compressed in the compressing step.

24. A method according to claim 21, wherein an error-correction capability of the first error-correction coding circuit is different from an error-correction capability of the second error-correction coding circuit.

25. A method according to claim 24, further comprising the step of compressing image data generated by an image pickup unit, wherein the first error-correction coding circuit and the second error-correction coding circuit are adapted to code image data compressed in the compressing step.

26. A method according to claim 21, further comprising the step of compressing image data generated by an image pickup unit, wherein the first error-correction coding circuit and the second error-correction coding circuit are adapted to code image data compressed in the compressing step.

* * * * *

UNITED STATES PATENT AND TRADEMARK OFFICE
CERTIFICATE OF CORRECTION

PATENT NO.   : 6,330,695 B1                                              Page 1 of 1
DATED        : December 11, 2002
INVENTOR(S)  : Hideyuki Arai It is certified that error appears in the above-identified patent and that said Letters Patent is hereby corrected as shown below:

Column 2,
Line 3, "commonly" should read -- common --;
Line 6, "of" should be deleted.

Column 5,
Line 9, "an" should read -- a --.

Column 8,
Line 28, "establishes," should read -- establish, --;
Line 66, "signal, it" should read -- signal. It --.

Column 11,
Line 41, "to" should be deleted.

Signed and Sealed this

Twenty-eighth Day of May, 2002

Attest:

JAMES E. ROGAN
*Attesting Officer*    *Director of the United States Patent and Trademark Office*